United States Patent
Jacobsz (10) Patent No.: US 7,035,779 B2
(45) Date of Patent: Apr. 25, 2006

(54) PRINT ENGINE SIMULATOR

(75) Inventor: Coenraad J. Jacobsz, North Ryde (AU)

(73) Assignee: Canon Kabushiki Kaisha, Tokyo (JP)

(*) Notice: Subject to any disclaimer, the term of this patent is extended or adjusted under 35 U.S.C. 154(b) by 801 days.

(21) Appl. No.: 10/022,505

(22) Filed: Dec. 20, 2001

(65) Prior Publication Data

US 2002/0157087 A1    Oct. 24, 2002

(30) Foreign Application Priority Data

Dec. 22, 2000   (AU) ................................ PR2309

(51) Int. Cl.
*G06F 17/50*    (2006.01)

(52) U.S. Cl. ............................. 703/13; 703/6
(58) Field of Classification Search ................. 703/13
See application file for complete search history.

(56) References Cited

U.S. PATENT DOCUMENTS

| | | | | |
|---|---|---|---|---|
| 5,835,688 A | * | 11/1998 | Fromherz | 358/1.13 |
| 6,081,856 A | * | 6/2000 | Comer | 710/67 |
| 6,111,886 A | * | 8/2000 | Stewart | 370/438 |
| 6,344,901 B1 | * | 2/2002 | Simon et al. | 358/1.9 |

FOREIGN PATENT DOCUMENTS

| EP | 0 747 791 A2 | 12/1996 |
|---|---|---|
| EP | 0 747 792 A2 | 12/1996 |

OTHER PUBLICATIONS

IBM Technical Disclosure, "Multiple Control Unit/Device Emulator for Testing Computer Programs", Sep. 1971, pp. 1212-1213, vol. 14, No. 4.*
McConnell, Steve; "Code Complete", 1993, Microsoft Press.*
Tanenbaum, Andrew S.; "Computer Networks", 1988, Prentice-Hall.*

* cited by examiner

*Primary Examiner*—Paul L. Rodriguez
*Assistant Examiner*—Russell L. Guill
(74) *Attorney, Agent, or Firm*—Fitzpatrick, Cella, Harper & Scinto (57) ABSTRACT

A print engine simulator (110) is disclosed. The simulator (110) is adapted for use in a development system including a print controller (100) adapted to communicate with a print engine (106) thereby to control said print engine (106). The simulator comprises interpreter means for interpreting a communication from the print controller (100) into hierarchical communication elements, a state machine representation of the print engine (106), said state machine being responsive to the communication, and display means adapted to display at least one of the communication from the print controller (100), the hierarchical communication elements, and an associated communication from the state machine.

13 Claims, 7 Drawing Sheets

Link Layer  Wed 20/12/2000  13:19:21.2  2321056423
Rx: Bytes 2198  LnkPk 138  Packs 95
Tx: Bytes 2150  LnkPk 135  Packs 132
DSR 1  CTS 1  DTR 1  RTS 1

502

50813 Tx Response#1. PageID 38  Result OK
50993 Tx Response#2. PageID 37  Status 0
51033 Tx Response#3. PageID 38
51063 Rx Command#1 PageID = 38
51073 Rx Command#2 PageID = 39
51893 Tx Response#1. PageID 39  ResultOK
52073 Tx Response#2. PageID 38  Status 0
52113 Tx Response#3. PageID 39
52143 Rx Command#1 PageID = 39
52153 Rx Command#2 PageID = 40
52973 Tx Response#1. PageID 40  Result OK
53153 Tx Response#2. PageID 39  Status 0
53193 Tx Response#3. PageID 40
53223 Rx Command#1 PageID = 40
53233 Tx Command#2 PageID = 41

PRINT ENGINE SIMULATOR

COPYRIGHT NOTICE

This patent specification contains material that is subject to copyright protection. The copyright owner has no objection to the reproduction of this patent specification or related materials from associated patent office files for the purposes of review, but otherwise reserves all copyright whatsoever.

1. Technical Field of the Invention

The present invention relates generally to software development system simulators and, in particular, to simulators for print engines. The present invention relates to a method and apparatus for simulating a print engine. The invention also relates to a computer program product including a computer readable medium having recorded thereon a computer program for simulating a print engine.

TRADEMARK ACKNOWLEDGMENT

The following description may include words which are, or are asserted to be, proprietary names or trademarks. The inclusion of such words does not imply that such words have acquired, for legal purposes, a non-proprietary or generic significance. Furthermore, no judgement is implied concerning their legal status. In cases where it is considered that proprietary rights may attach to a word, this is indicated by a $^{propr}$superscript, noting that this does not imply a legal judgement concerning the legal status of such words.

2. Background Art

Software development can be a time-consuming task, and is often complicated by the fact that various system elements are developed in parallel. One such development task is that of developing print engine controllers for print engines in a situation where the print engine has not yet been developed, but where development of the print engine controller must nonetheless proceed in order to meet project schedules. A traditional method for performing development of such a print engine controller is to use a protocol analyser to capture data signal from the print engine controller and print engine under development. The protocol analyser is able, in principle, to perform data reconstruction on the captured bits, log the data streams, for both individual bits and flow control signals, and provide useful information to the pent engine controller developer.

Protocol analysers, however, provide more information than is required, since typically physical layer communications at the Universal Asynchronous Receiver Transmitter (UART) level is already proven by the time the print engine controller development task is commenced. Protocol analysers are also typically limited in programability, and do not readily lend themselves to analysing and/or controlling customised event sequences. It would be necessary to program the protocol analyser byte by byte in order to send correct data for a wide variety of proprietary data packets. Interpretation of data received from the print controller would also require custom programming of the protocol analyser.

The protocol analyser can be used to analyse raw data flowing between the print engine controller under development and an actual print engine. The protocol analyser can be used to debug low level communications software in the controller and the engine, by manually checking the byte values sent for each data packet. This can be tedious and repetitive, particularly when packets contain a large number of bytes that need to be reassembled into 16 bit and/or 32 bit values, and particularly if checksum values need to be manually calculated to verify low level communication software operation between the controller and the engine.

An additional problem which arises in this approach is that once low level communication software is completely debugged, the protocol analyser still provides a very large amount of data, since it is operating at the individual byte level. This is confusing to the developer, and typically masks the higher layer protocol messages with which the developer is then concerned.

Another approach to development of the print engine controller is to use an actual print engine in concert with the print engine controller under development. A disadvantage of such an approach is that although the print engine responds to the print engine controller in, presumably, the correct manner, this approach does not provide information display in regard to data packets being sent and received between the print engine controller and the print engine. Display of such information is useful, if not essential, to a developer during initial stages of code debugging, in which case the developer typically needs to check individual bytes to ensure that low level communication software is operating correctly.

SUMMARY OF THE INVENTION

It is an object of the present invention to substantially overcome, or at least ameliorate, one or more disadvantages of existing arrangements.

According to a first aspect of the invention there is provided a computer program for directing a processor to execute a method for simulating a print engine for a development system including a print controller adapted to communicate with said print engine to thereby control said print engine, said program comprising:

code for providing a state machine representation of the print engine, said state machine being responsive to a communication from the print controller;

code for interpreting said communication from the print controller into hierarchical communication elements; and code for displaying at least one of the communication from the print controller, the hierarchical communication elements, and an associated communication from the state machine.

According to another aspect of the invention there is provided a computer program product including a computer readable medium having recorded thereon a computer program for directing a processor to execute a method for simulating a print engine for a development system including a print controller adapted to communicate with said print engine to thereby control said print engine, said program comprising:

code for providing a state machine representation of the print engine, said state machine being responsive to a communication from the print controller;

code for interpreting said communication from the print controller into hierarchical communication elements; and code for displaying at least one of the communication from the print controller, the hierarchical communication elements, and an associated communication from the state machine.

According to another aspect of the invention, there is provided a print engine simulator for a development system including a print controller adapted to communicate with a print engine to thereby control said print engine, the simulator comprising:

interpreter means for interpreting a communication from the print controller into hierarchical communication elements;

a state machine representation of the print engine, said state machine being responsive to the communication; and display means adapted to display at least one of the communication from the print controller, the hierarchical communication elements, and an associated communication from the state machine.

According to another aspect of the invention, there is provided a print engine simulator for a development system including a print controller adapted to communicate with a print engine to thereby control said print engine, the simulator comprising:

a memory for storing a program; and a processor for executing the program, said program comprising:

code for providing a state machine representation of the print engine, said state machine being responsive to a communication from the print controller;

code for interpreting said communication from the print controller into hierarchical communication elements; and code for displaying at least one of the communication from the print controller, the hierarchical communication elements, and an associated communication from the state machine.

According to another aspect of the invention there is provided a development system including a print engine simulator, and a print controller adapted to communicate with a print engine to thereby control said print engine, wherein the simulator comprises:

interpreter means for interpreting a communication from the print controller into hierarchical communication elements;

a state machine representation of the print engine, said state machine being responsive to the communication; and display means adapted to display at least one of the communication from the print controller, the hierarchical communication elements, and an associated communication from the state machine.

According to another aspect of the invention there is provided a method of simulating a print engine for a development system including a print controller adapted to communicate with said print engine to thereby control said print engine, the method comprising steps of:

providing a state machine representation of the print engine, said state machine being responsive to a communication from the print controller;

interpreting said communication from the print controller into hierarchical communication elements; and displaying at least one of the communication from the print controller, the hierarchical communication elements, and an associated communication from the state machine.

BRIEF DESCRIPTION OF THE DRAWINGS

One or more embodiments of the present invention will now be described with reference to the drawings, in which.

DETAILED DESCRIPTION INCLUDING BEST MODE

Where reference is made in any one or more of the accompanying drawings to steps and/or features, which have the same reference numerals, those steps and/or features have for the purposes of this description the same function(s) or operation(s), unless the contrary intention appears.

Some portions of the description which follows are explicitly or implicitly presented in terms of algorithms and symbolic representations of operations on data within a computer memory. These algorithmic descriptions and representations are the means used by those skilled in the data processing arts to most effectively convey the substance of their work to others skilled in the art, An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that the above and similar terms are to be associated with the appropriate physical quantities and are merely convenient labels applied to these quantities. Unless specifically stated otherwise, and as apparent from the following, it will be appreciated that throughout the present specification, discussions utilizing terms such as "scanning", "calculating", "determining", "replacing", "generating" "initializing", "outputting", or the like, refer to the action and processes of a computer system, or similar electronic device, that manipulates and transforms data represented as physical (electronic) quantities within the registers and memories of the computer system into other data similarly represented as physical quantities within the computer system memories or registers or other such information storage, transmission or display devices.

The present specification also discloses apparatus for performing the operations of the methods. Such apparatus may be specially constructed for the required purposes, or may comprise a general purpose computer or other device selectively activated or reconfigured by a computer program stored in the computer. The algorithms and displays presented herein are not inherently related to any particular computer or other apparatus. Various general purpose machines may be used with programs in accordance with the teachings herein. Alternatively, the construction of more specialized apparatus to perform the required method steps may be appropriate. The structure of a conventional general purpose computer will appear from the description below.

In addition, the present specification also discloses a computer readable medium comprising a computer program for performing the operations of the methods. The computer readable medium is taken herein to include any transmission medium for communicating the computer program between a source and a designation. The transmission medium may include storage devices such as magnetic or optical disks, memory chips, or other storage devices suitable for interfacing with a general purpose computer. The transmission medium may also include a hard-wired medium such as exemplified in the Internet system, or wireless medium such as exemplified in the GSM mobile telephone system. The computer program is not intended to be limited to any particular programming language and implementation thereof. It will be appreciated that a variety of programming languages and coding thereof may be used to implement the teachings of the disclosure contained herein.

Where reference is made in any one or more of the accompanying drawings to steps and/or features, which have the same reference numerals, those steps and/or features have for the purposes of this description the same function(s) or operation(s), unless the contrary intention appears.

The principles of the preferred method described herein have general applicability to software development in systems using serial or other communication between system elements. However, for ease of explanation, the steps of the preferred method are described with reference to systems comprising print engine controllers and print engines. It is not intended that the present invention be limited to the described method.

Figure 1:
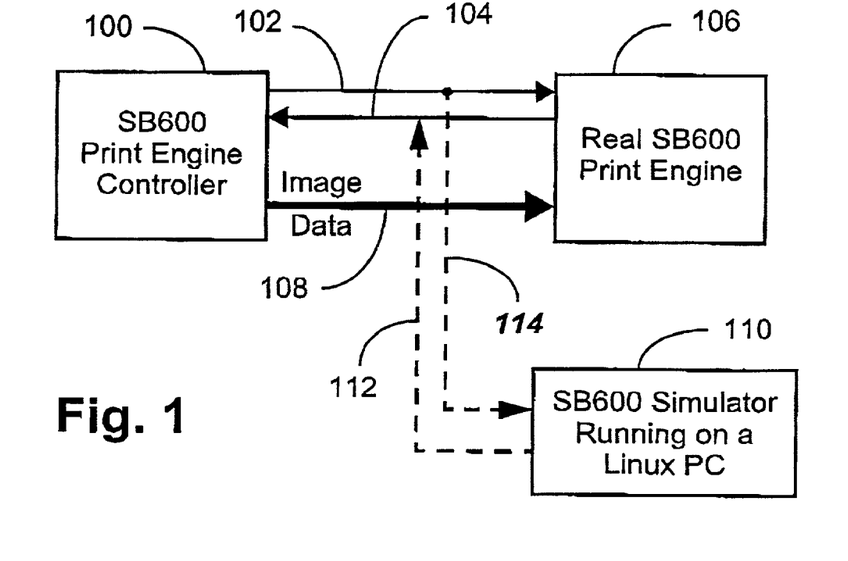
FIG. 1 is a block representation of a print system under development.

FIG. 1 shows a printer development system arrangement comprising a print engine controller 100 and a print engine 106. The print engine 106 is an electro-mechanical device which marks the paper, and the controller 100 is typically a microprocessor-based single-board computer which sends control commands via a serial connection to the print engine 106. The serial connection in FIG. 1 is depicted by unilateral arrows 102 and 104 respectively. The print engine 106 is typically controlled using a standard asynchronous low speed (9600–38400 bits per second) serial link protocol, and video data is typically fed to the printer engine by means of a high speed bus 108 using a parallel interface (not shown).

In the course of equipment development, it is often the case that the print engine controller 100 must be developed prior to availability of the print engine 106. In such cases, a print engine simulator 110 can be use to assist in development of the print engine controller 100. The simulator 110 is connected to the print engine controller 100 using the serial link 102, 104 which is depicted by dashed arrows 114 and 112 when connected to the simulator 110 rather than to the print engine 106.

Figure 2:
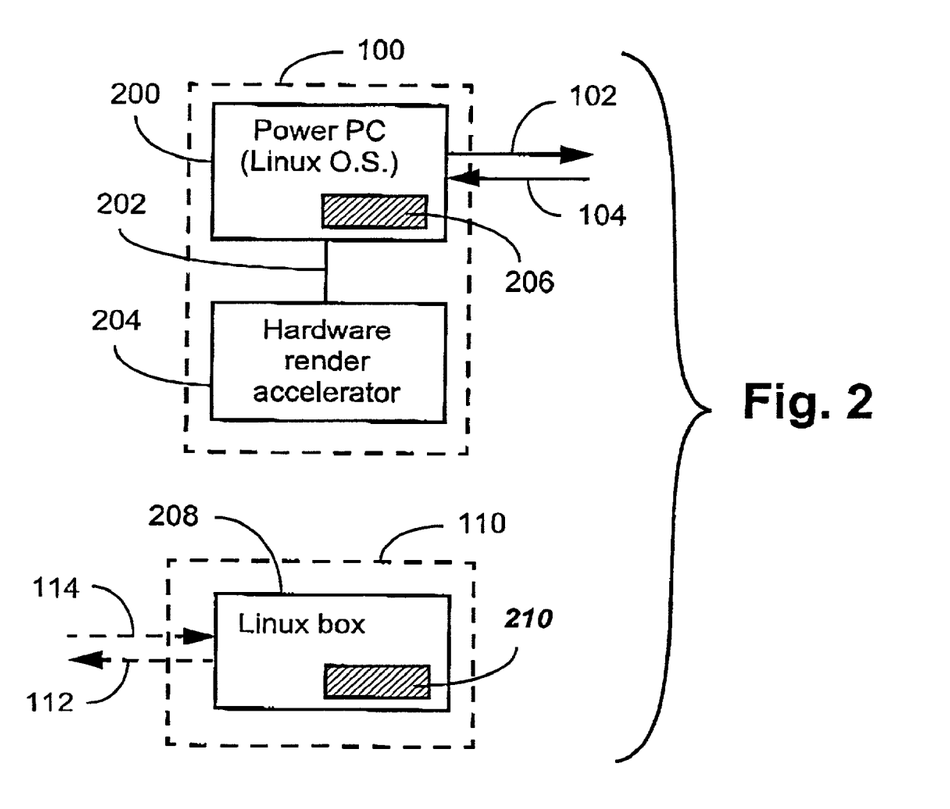
FIG. 2 shows details for a print engine controller and a print engine simulator.

FIG. 2 shows internals of the print engine controller 100, and the print engine simulator 110. The print engine controller 100 comprises typically an embedded power PC 200 running a Linux$^{propr}$ operating system, the PC being connected by a connection 202 to a hardware render accelerator 204. The particular software to be developed in the present scenario is the print job scheduling software 206 which runs on the controller processor.

The print engine simulator 110 is typically realised using a Linux$^{propr}$ box 208, running software 210 which simulates, using a state machine representation, behaviour of the print engine 106 at least in regard to the serial command protocol and print scheduling. Although the present description considers particular hardware platforms running the Linux$^{propr}$ operating system, other platforms and operating systems can be used. Thus, for example, the print engine simulator can also be realised on a general purpose computer system 700 such as is described in relation to FIG. 8.

A brief outline of communications concepts and terminology is useful in setting the scene for the later description. The ISO/OSI (International Standard Organization's Open System Interconnect) breaks communications up into 7 layers, which are physically connected on one layer only, and virtually connected on all the other layers.

System designers rarely use all these layers, which are only useful in very complex large scale systems. Some designers use very thin layer representations and accordingly combine the layers to form fewer layers. Only 3 of these layers—1, 2 and 7 are used in the present description.

The physical layer (ie. Layer 1) is the cable used to connect between the controller's serial port 102, 104 and the engines simulators serial port 114, 112. Layer 2, the data link layer may specify a maximum packet size, a header, checksum, acknowledge and retransmission method to ensure that data arrives uncorrupted. This is independent of the encapsulated data packets wrapped in these extras. The protocol on Layer 2 is independent of the protocol on layer 7. Both Layer 2 and Layer 7 are typically pre-specified inputs to the development process and cannot be changed.

Figure 3:
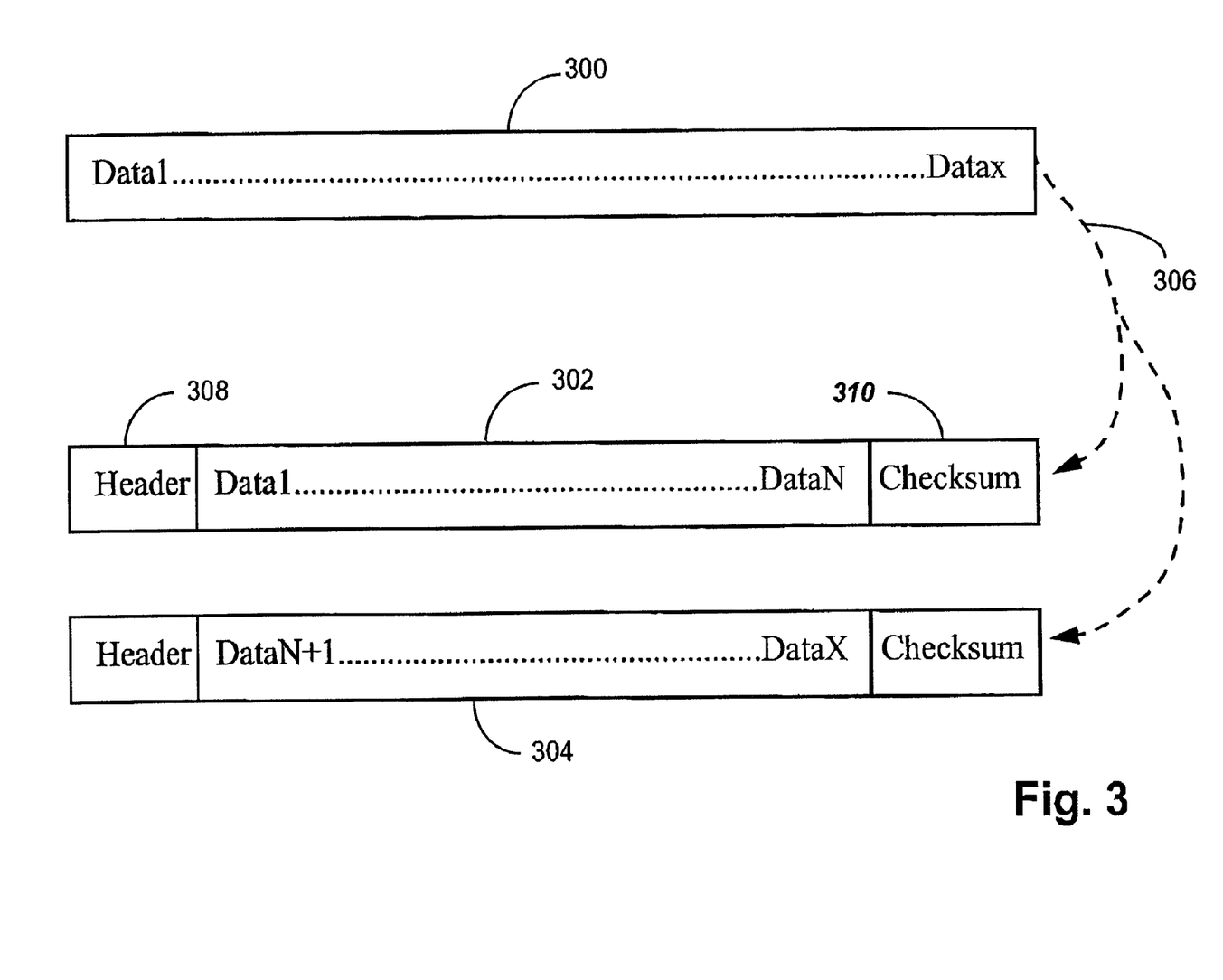
FIG. 3 depicts a packetised communication fragment between the controller and the print engine.

FIG. 3 depicts a communication fragment according to the three layer communication model described above. As an example it is assumed that the application layer in the controller 100 sends a packet 300 having X bytes to the application layer in the engine/simulator 106, 110. The maximum data link layer packet size is only N bytes, and so the software breaks it into two packets 302, 304, and adds a header 308 and a checksum 310 to each packet 302, 304 for transmission. The receiver (not shown) in the engine/simulator 106/100 assembles the raw bytes until it has enough to calculate the checksum. From information in the header 308 the receiver knows that another packet is needed to complete the higher level data packet, and so it waits until the second packet is received. The receiver then assembles all the data and passes it on to the application layer. The application layer interprets the data based on the command that comprises the first two bytes. The command may, for example, be an instruction to set certain parameters received from the engine.

Because the protocol on both these layers are typically proprietary, no standard protocol analyser will typically be able to interpret the protocol without customised programming. It is however possible to write dedicated code to perform the assembling and interpreting described, and also to advantageously display the values of the data bytes, the headers and the checksums.

Since the purpose of the print engine simulator 110 is to debug the code on the controller 100, it is useful to initially check if the controller 100 is sending the correct byte stream to build a data link layer packet, and also to check if the controller 100 is interpreting the incoming bytes correctly. To simplify that particular process, the simulator 110 must be able to display every single byte received by its serial port.

Figure 4:
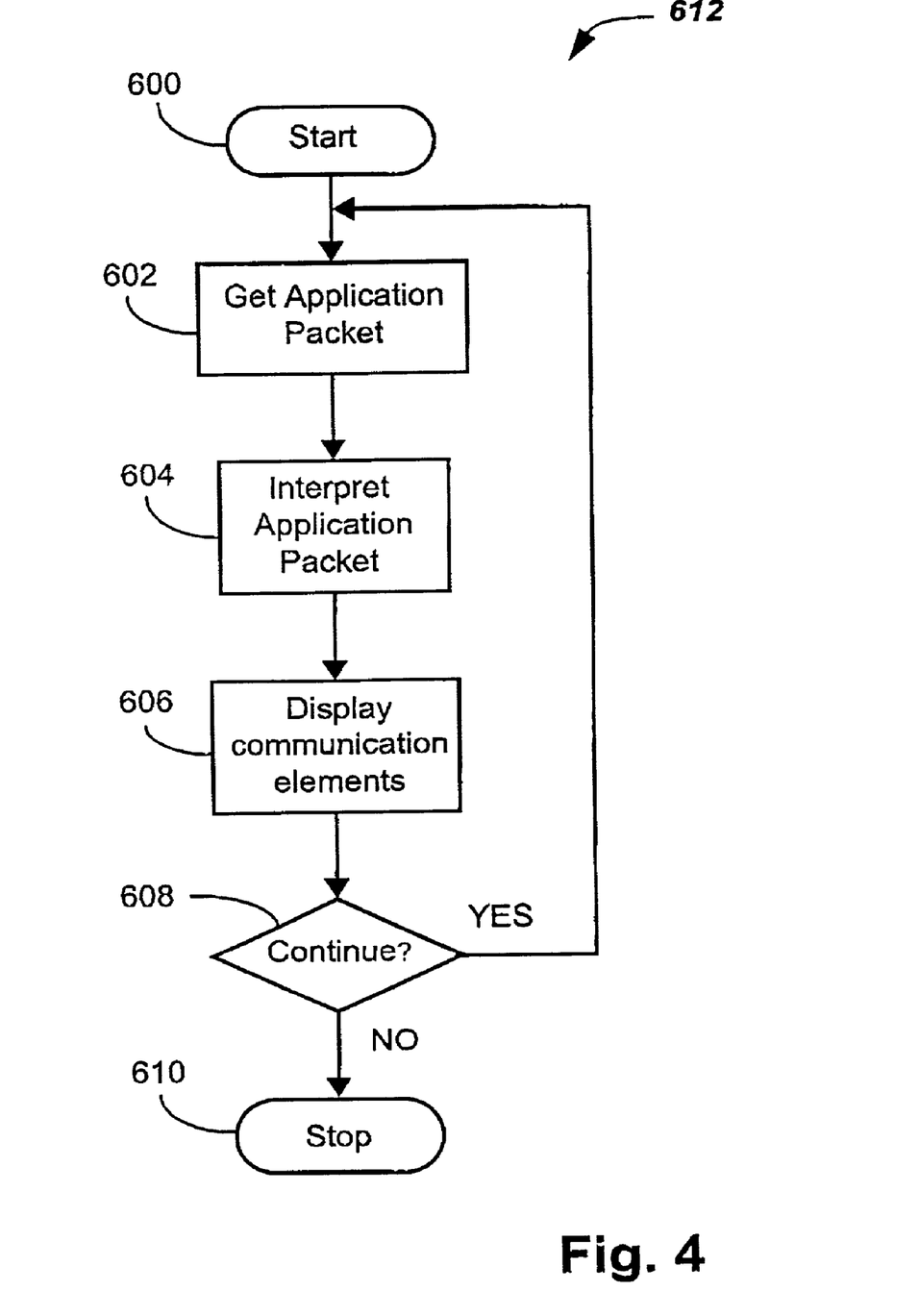
FIG. 4 shows a simulation process in accordance with one arrangement of the print engine simulator.

FIG. 4 depicts an advantageous process 612 which provides the desired print engine simulator functionality. The simulation process 612, running on the simulator 110, which can be realised on the Linux$^{prop}$ box 208 or using the computer system 700, commences with a starting step 600. Thereafter, the process gets an application packet in a step 602 from the communication connections 112, 114. An application packet on the connection 112 is generated by the state machine representation of the print engine running on the simulator 110, and an application packet on the connection 114 is generated by the print engine controller 100. Thereafter, in a step 604, the process 612 interprets the application packet, after which communication elements of the application packet are displayed in a step 606. Thereafter, in a decision step 608, if the process 612 is to continue, then the process is directed in accordance with a "YES" arrow back to the step 602. If the process 612 is not to continue, then the process is directed in accordance with a "NO" arrow to a stop 610 where the process 612 terminates.

Figure 5:
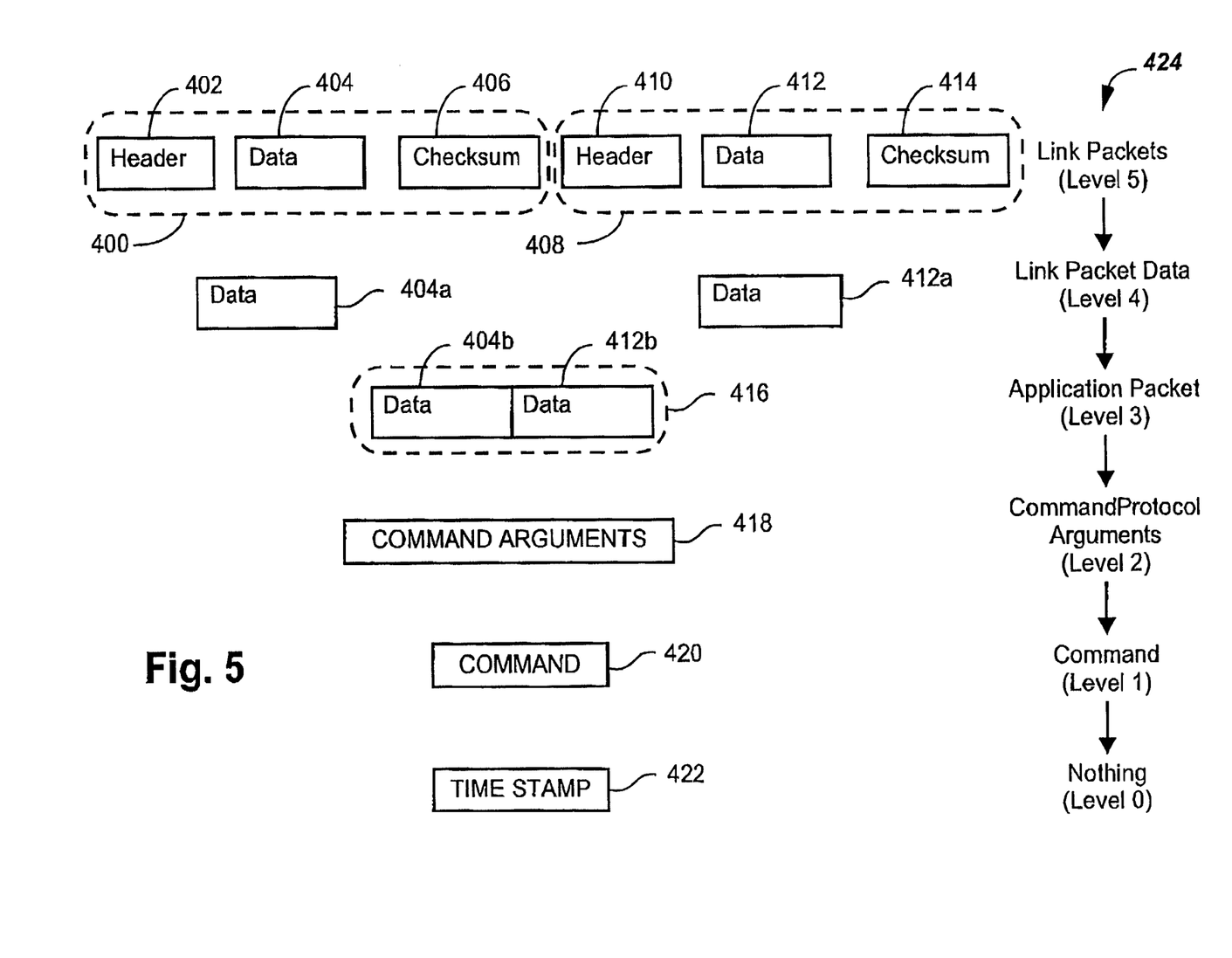
FIG. 5 shows hierarchical communication elements of interest to a developer.

FIG. 5 depicts hierarchical communication elements of interest to the developer. FIG. 5 also foreshadows functionality of one arrangement of the print engine simulator, and shows five "levels" 424 of complexity which a developer can invoke when using the simulator.

In brief, when a large application layer data packet is sent, it will be broken up in two or more data link layer packets. These individual packets 404a, 412a can be separately seen and inspected on the simulator. When the programmer is satisfied that operation at the data link layer is satisfactory, he can again lower the debug level by one level to reduce the amount of clutter on the screen to Level 3 and so on. Referring to FIG. 5 while referring back to FIG. 3, it is noted that the packet sent by the application layer in the controller to the application layer in the engine/simulator is X bytes long, and is represented by data 416. The maximum data link layer packet size is only N bytes, and so the communication software breaks the application layer packet into two packets, represented by the reference numerals 404A, and 412A. The communication software adds a header and checksum to each of the aforementioned packets 404A and 412A, as represented by the reference numerals 400 and 408. A more detailed description is now provided.

When the controller code is run for the very first time, the developer cannot be sure that even the code on the data link layer is bug free, and so the developer needs to see every single byte that is sent by the serial port. The simulator 110 can display these raw bytes by setting the highest debug level ie Level 5. At the datalink layer (ie Layer 5), link packets 400, 408 contain respective headers 402, 410, data 404, 412, and checksums 406, 414. These contents of individual link packets 400 and 408 are the highest level hierarchical communication elements which the present arrangement allows the developer to display. In FIG. 5, this is depicted as a "level 5" simulation level, where the available range of simulation levels is depicted by an reference numeral 424.

When the controller developer, having set and used the simulator at Level 5, is satisfied that data link layer packets are correctly assembled, and that the headers are correct and the checksums are correctly calculated, he or she can start focussing on the actual data that is sent. For that, the debug level may be lowered one level to Level 4. This allows him to see what the meaning is for the command bytes of these packets, by reducing the amount of detail provided, since at Level 4, only the corresponding data elements 404A and 412A are displayed, It is noted that the data element 404A is, in fact, the data element 404, however the data element has been provided with a new reference numeral ie. 404A to indicate that the data element is being displayed in a level 4 simulation.

Once the developer has completed debugging operations at level 4, he or she is again able to reduce the amount of detail provided by dropping to level 3, at which point the aforementioned data elements, now designated 404B and 412B are reassembled, as depicted by a dashed box 416.

As previously described, once the developer has completed debugging procedures at level 3, he is able to drop down a level to level 2 at which semantic arguments associated with the particular command being communicated are displayed, as depicted by a reference numeral 418. At the next level, ie. level 1, only a semantic designation for the command itself 420 is displayed, this representing the highest level of abstraction, which is equivalent to the lowest amount of detail displayed to the developer. A following level, ie. level 0 has no data display associated with it unless an error such as an invalid command code or invalid command sequence is present. A time stamp 422 is displayed whenever something is displayed.

In summary, the arrangement depicted by FIG. 5 can advantageously allow selected hierarchical representations of the communication to be viewed by the developer. This approach is shown in textual form in Appendix A.

From an operational convenience perspective, the simulator levels can be conveniently changed by pressing a key, and no recompilation is needed.

Exemplary Pseudocode For Realizing The Above Functionality is provided in Appendix B. The code calls a function "GetApplPacket" to return an application layer packet. Another function "InterpretPacket" is used to interpret the packet. The GetApplPacket function will call another function "GetLinkPacket" in order to collect enough bytes to build a data link layer packet.

When the controller and the simulator are both running, too much data is generated to be read in real time. Reading the log files afterwards is tedious, especially if something went wrong early on in the sequence. It is useful to have a mode in which the simulator does not respond like the real engine, but can respond to a key-press to send a particular data packet to the controller. "Temporary debug print statements" on the controller can display the responses received from the simulator in this mode.

Figure 6:
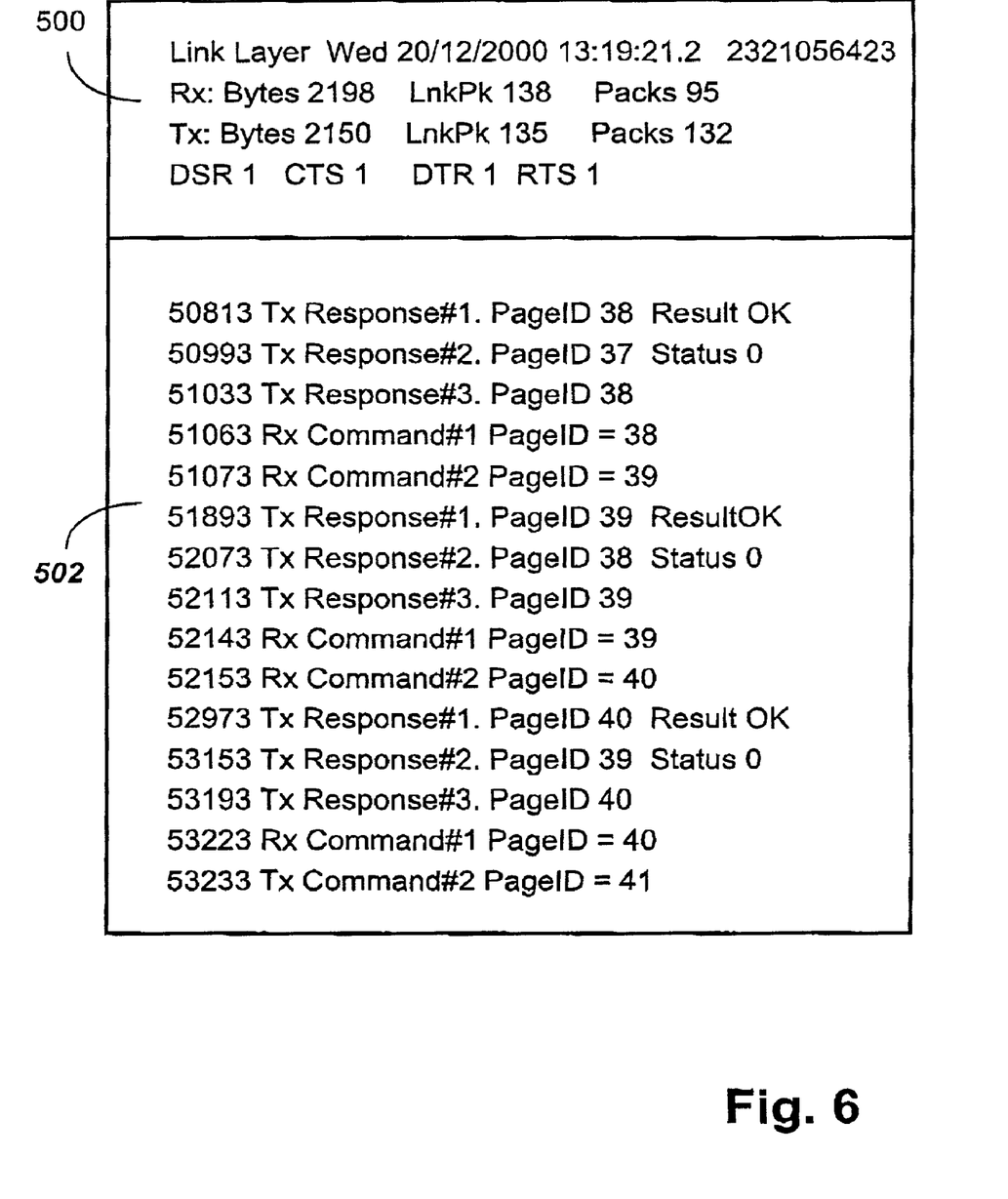
FIG. 6 depicts a two-part display arrangement providing for simultaneous display of pseudo-static and dynamic data.

FIG. 6 depicts a display arrangement providing for simultaneous display of both summarised pseudo-static information and dynamic information.

The exemplary screen display data in FIG. 6 for the data link layer screen is described in Appendix C. The top four lines of text in the screen display represent the "non-scrolling" display 500. The first line of text shows the screen name, the date, the time in hour/minute/second/decimal second notation, and the time in truncated seconds notation. The second line shows the number of bytes received by the simulator, and the corresponding number of link and application packets. The third line shows the number of bytes transmitted by the simulator, and the corresponding number of link and application packets. The fourth line shows the logic status of various control lines.

The following lines represent the "scrolling" display 502. Each line comprises a time stamp in milliseconds, a tag "Tx" or "Rx" indicating whether the communication element is transmitted or received by the simulator, a particular response message associated with the communication element, an identity number for the page being printed, and a print result.

A number of further exemplary screens are described in Appendix D.

If the simulator is connected to more sub-systems than just the single controller, additional debug screen modes can be used with separate, individually set debug levels to display the data flowing between the two in the desired amount of detail.

The aforementioned arrangements can be further enhanced as follows. It is a standard function of the DTR/DSR lines are to reset the communications interface(s) when it is de-asserted, but in the printer it will also reset the engine state machine and indicate when it is ready again. The simulator incorporates this feature, which is useful during development of the controller software. When an illegal condition is detected, the controller displays the error message and quits, closing the serial port, which will reset the simulator. This simple process leaves the developer free to concentrate on debugging the controller instead of manually resetting the simulator.

Figure 7:
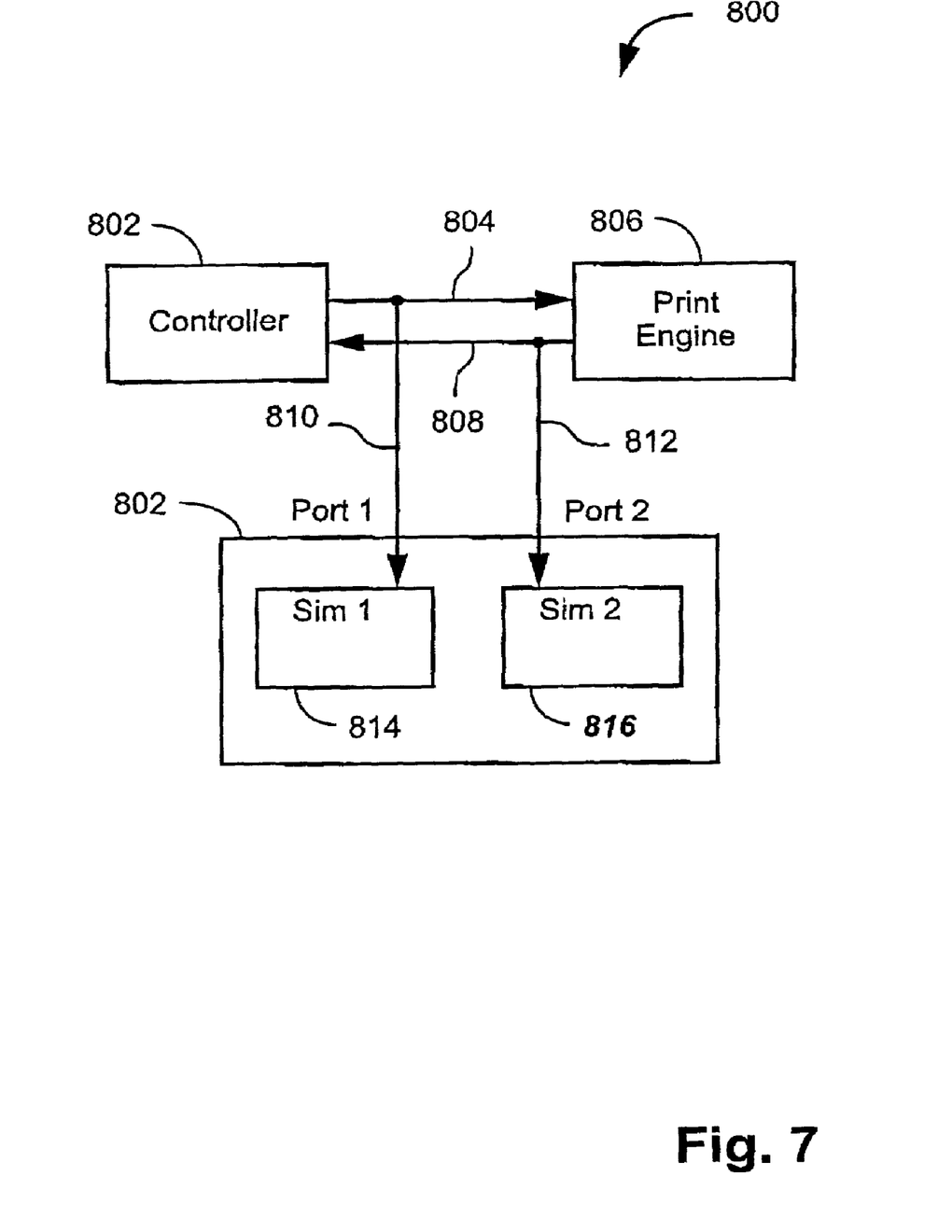
FIG. 7 depicts use of multiple instances of a simulator being used in a protocol analyser mode.

FIG. 7 shows a further variant of the aforementioned arrangements, in which the simulator does not respond like the engine would have, but only monitors the serial port, logs and timestamps the commands. This is achieved by the "If not Monitor mode" statement in the code of Appendix B. Two instances 814 and 816 of the simulator in monitor mode can be run on a single Linux$^{propr}$ box 802 to analyse the command traffic between a real controller 802 and print engine 806, in much the same manner as a high level protocol analyser.

Figure 8:
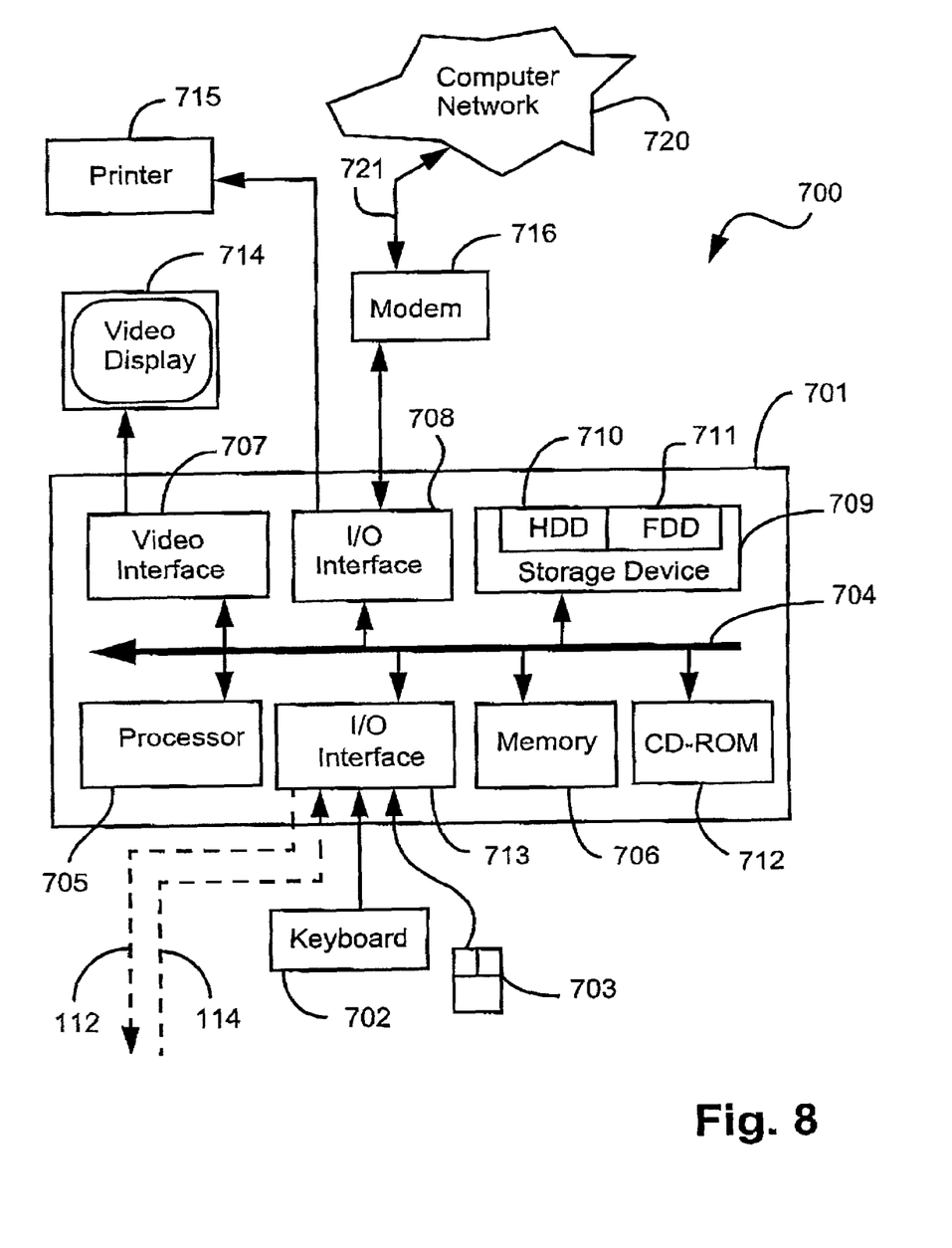
FIG. 8 depicts a general purpose computer upon which described arrangements can be practiced.

The method of simulating a print engine can be practiced using a general-purpose computer system 700, such as that shown in FIG. 8 wherein the processes of FIG. 4 may be implemented as software, such as an application program executing within the computer system 700. In particular, the steps of method of simulating a print engine are effected by instructions in the software that are carried out by the computer. The software may be divided into two separate parts; one part for carrying out the simulating a print engine methods; and another part to manage the user interface between the latter and the user. The software may be stored in a computer readable medium, including the storage devices described below, for example. The software is loaded into the computer from the computer readable medium, and then executed by the computer. A computer readable medium having such software or computer program recorded on it is a computer program product. The use of the computer program product in the computer preferably effects an advantageous apparatus for simulating a print engine.

The computer system 700 comprises a computer module 701, input devices such as a keyboard 702 and mouse 703, output devices including a printer 715 and a display device 714. A Modulator-Demodulator (modem) transceiver device 716 is used by the computer module 701 for communicating to and from a communications network 720, for example connectable via a telephone line 721 or other functional medium. The modem 716 can be used to obtain access to the Internet, and other network systems, such as a Local Area Network (LAN) or a Wide Area Network (WAN).

The computer module 701 typically includes at least one processor unit 705, a memory unit 706, for example formed from semiconductor random access memory (RAM) and read only memory (ROM), input/output (I/O) interfaces including a video interface 707, and an I/O interface 713 for the keyboard 702 and mouse 703 and optionally a joystick (not illustrated), and an interface 708 for the modem 716. The I/O interface 713 provides for communication with the engine controller 100 on connections 112, 114, which are depicted by dashed lines in FIG. 8. A storage device 709 is provided and typically includes a hard disk drive 710 and a floppy disk drive 711. A magnetic tape drive (not illustrated) may also be used. A CD-ROM drive 712 is typically provided as a non-volatile source of data, The components 705 to 713 of the computer module 701, typically communicate via an interconnected bus 704 and in a manner which results in a conventional mode of operation of the computer system 700 known to those in the relevant art. Examples of computers on which the described arrangements can be practised include IBM-PC's and compatibles, Sun Sparcstations or alike computer systems evolved therefrom.

Typically, the application program is resident on the hard disk drive 710 and read and controlled in its execution by the processor 705. Intermediate storage of the program and any data fetched from the network 720 may be accomplished using the semiconductor memory 706, possibly in concert with the hard disk drive 710. In some instances, the application program may be supplied to the user encoded on a CD-ROM or floppy disk and read via the corresponding drive 712 or 711, or alternatively may be read by the user from the network 720 via the modem device 716. Still further, the software can also be loaded into the computer system 700 from other computer readable medium including magnetic tape, a ROM or integrated circuit, a magneto-optical disk, a radio or infra-red transmission channel between the computer module 701 and another device, a computer readable card such as a PCMCIA card, and the Internet and Intranets including email transmissions and information recorded on websites and the like. The foregoing is merely exemplary of relevant computer readable mediums. Other computer readable media may alternately be used.

The method of simulating a print engine may alternatively be implemented in dedicated hardware such as one or more integrated circuits performing the functions or sub functions of simulating a print engine. Such dedicated hardware may include graphic processors, digital signal processors, or one or more microprocessors and associated memories.

INDUSTRIAL APPLICABILITY

It is apparent from the above that the arrangements described are applicable to the computer and data processing industries.

The foregoing describes only some embodiments of the present invention, and modifications and/or changes can be made thereto without departing from the scope and spirit of the invention, the embodiments being illustrative and not restrictive.

APPENDIX A

A textual example of simulator operation and functionality.

Example:
An application layer packet consists of 16 bytes represented in hexadecimal values:
00 11 22 33 44 55 66 77 88 99 AA BB CC DD EE FF
Data link layer packets may only be 10 bytes long, so it gets broken in two packets:
[00 11 22 33 44 55 66 77 88 99] and [AA BB CC DD EE FF]
Each gets a header and checksum:
[AA 55 01 0A] [00 11 22 33 44 55 66 77 88 99][45 3A] and
[AA 55 02 06] [AA BB CC DD EE FF][A4 F7]
The display on a standard protocol analyser would look like this:
AA 55 01 0A 00 11 22 33 44 55 66 77 88 99 45 3A AA 55 02 06 AA BB CC DD EE FF A4 F7
With no breaks between packets which can be quite confusing
With debug level 5 selected the display looks like this:

| | |
|---|---|
| [AA 55 01 0A] [00 11 22 33 44 55 66 77 88 99][45 3A] | (Link packet 1 with header and checksum) |
| [00 11 22 33 44 55 66 77 88 99] | (Link packet 1) |
| [AA 55 02 06] [AA BB CC DD EE FF][A4 F7] | (Link packet 2 with header and checksum) |
| [AA BB CC DD EE FF] | (Link packet 2) |
| [00 11 22 33 44 55 66 77 88 99 AA BB CC DD EE FF] | (Appl packet) |

Command #1 + Timestamp
Parameter #1 = XXX
Parameter #2 = YYY
Parameter #3 = ZZZ
Parameter #4 = ABC
Parameter #5 = KLM
With debug level 4 selected the display looks like this:

| | |
|---|---|
| [00 11 22 33 44 55 66 77 88 99] | (Link packet 1) |
| [AA BB CC DD EE FF] | (Link packet 2) |
| [00 11 22 33 44 55 66 77 88 99 AA BB CC DD EE FF] | (Appl packet) |

APPENDIX A-continued

A textual example of simulator operation and functionality.

Command #1 + Timestamp
Parameter #1 = XXX
Parameter #2 = YYY
Parameter #3 = ZZZ
Parameter #4 = ABC
Parameter #5 = KLM
With debug level 3 selected the display looks like this:
[00 11 22 33 44 55 66 77 88 99 AA BB CC DD EE FF] (Appl packet)
Command #1 + Timestamp
Parameter #1 = XXX
Parameter #2 = YYY
Parameter #3 = ZZZ
Parameter #4 = ABC
Parameter #5 = 600 dpi
With debug level 2 selected the display looks like this:
Command #1 + Timestamp
Parameter #1 = XXX
Parameter #2 = YYY
Parameter #3 = ZZZ
Parameter #4 = ABC
Parameter #5 = 600 dpi
With debug level 1 selected the display looks like this:
Command #1 + Timestamp
And with level 0 nothing is displayed except errors.
    A timestamp is displayed with all the information and saved in a log file for later investigation. The actual order in which the lines appear may be swapped around to simplify the code.

APPENDIX B

Exemplary Pseudocode For Realising Simulator Functionality

```
Application Task
Initialise (Open serial port etc.)
Loop forever
    GetApplPacket()
    InterpretPacket()
End loop
Function GetApplPacket
Do
    GetLinkPacket()
    Store packet
Until enough link packets
Assemble all link packets into application layer packet
If debug level > 3
    Display all bytes in appl packet
Return packet to caller
End function
Function GetLinkPacket
Get header and see how many more bytes needed
Do
    Get byte
Until enough bytes for LL packet
Is checksum OK ?
    Return packet to caller
Else Error
End function
Function InterpretPacket
Command = first 2 bytes in packet
If command = 12
    If not Monitor mode
    Set timer to send Response 4 in 500 ms
    If debuglevel > 2
        Display detail of command, e.g. Max Vert Area etc . . .
    If debuglevel > 1
    End if
Else if command = 20
    If not Monitor mode
    Set timer to send Response 5 in 300 ms
    If debuglevel > 2
        Display detail of command
    If debuglevel > 1
        Display command name
    End if
```

APPENDIX B-continued

Exemplary Pseudocode For Realising Simulator Functionality

```
Else if command = 30
    If not Monitor mode
        Send response 40
Else . . .
: : :
End if
End function InterpretPacket
User interface task
Loop forever
    Get key
    If key = D
        Debug level + 1 for active screen
        Limit to 5
    Else if key = d
        Debug level − 1 for active screen
        Limit to 0
    Else if key = 1
        Set active debug screen = 1
    Else if key = 2
        Set active debug screen = 2
    Else . . .
    :::
    :::
    End if
End loop
End user interface task
Display task
Loop forever
    Display active debug screen in non scrolling area
End loop
Unless otherwise mentioned, "Display" means on the scrolling area.
```

APPENDIX C

An Exemplary Simulator Data Link Layer Display Screen
Link Layer Wed 20 Dec. 2000 13:19:21.2 2321056423
Rx: Bytes 2198 LnkPk 138 Packs 95
Tx: Bytes 2150 LnkPk 135 Packs 132
DSR 1 CTS 1 DTR 1 RTS 1
50813 Tx Response 190 1. PageID 38 Result OK
50993 Tx Response 190 2. PageID 37 Status 0
51033 Tx Response 190 3. PageID 38
51063 Rx Command #1 PageID=38
51073 Rx Command 190 2 PageID=39
51893 Tx Response #1. PageID 39 ResultOK
52073 TX Response #2. PageID 38 Status 0
52113 Tx Response #3. PageID 39
52143 Rx Command #1 PageID=39
52153 Rx Command #2 PageID=40
52973 Tx Response #1. PageID 40 Result OK
53153 Tx Response #2. PageID 39 Status 0
53193 Tx Response #3. PageID 40
53223 Rx Command #1 PageID=40
53233 Tx Command #2 PageID=41
54053 Tx Response #1. PageID 41 Result OK
54233 Tx Response #2. PageID 40 Status 0
54273 Tx Response #3. PageID 41
54303 Rx Command #1 PageID=41
54314 Rx Command #2 PageID=42
55133 Tx Response #1. PageID 42 Result OK
55313 Tx Response #2. PageID 41 Status 0
55353 Tx Response #3. PageID 42
55383 Rx Command #1 PageID=42
56393 Tx Response #2. PageID 42 Status 0
56423 Rx Command #3 PageID =42

APPENDIX D

Futher Exemplary Simulator Display Screens

Data link layer screen

This screen handles all the relevant issues relating to low level communications.

It displays on the nonscroll area 500, items such as things like numbers of bytes, link layer packets and application layer packet received and transmitted. It also displays the status of the flow control lines and modem control lines.

The keyboard turns on/off monitor mode, i.e. automatic response to packets, or manual transmission of packets.

Application layer screen

The nonscroll area 500 shows the same as for the data link layer screen.

The screen still handles communications, but will send with different keystrokes different packets of the controller, e.g
I=Response #1
M=Response #2
N=Response #3
E=Response #4
Etc. . .
D/d=Debug level raise/lower for communications as described in relation to FIG. 5 and is exemplified by the pseudo-code example.

Set Status screen

This screen doesn't have much to display in the nonscroll area 500 except for the time, and also the user input when the status values are typed in.

The following status values that are sent back with some of the packets to the controllers may be set in this screen mode.
g=Response #1
w=Response #2
o=Response #3
s=Response #4

File and Error screen

The following functions are available in this mode:
f Flush logfile (to be able to read latest stuff)
r=Response #1
c/C Introduce Page Cancel Before/After Response #2
j/J Introduct Jam Before/After Response #3
e Send Response #4

Page store screen

This screen has no commands, but displays in the non scroll area 500 the state of the various pages.

States are: Cancelled, New, Picked up, Bitmap_Done, Printing, Complete

This mode would display up to 3 pages in the system, each with its page ID number, e.g
3 Picked up
2 Bitmap done
1 Complete And a few milliseconds later:
4 Picked up
3 Bitmap
2 Complete Controller emulation screen This mode can be used to send controller commands manually to a real print engine, or to another instance of the simulator to actually test the simulator's behaviour during development of the simulator itself. A bootstrap method of developing the simulator witht he additional advantage of providing a simple simulator for the print controller itself.

To do a pring Job:
e Command 190 1 (Then wait for Response 190 1)
v Command 190 2 (Then wait for Response 190 2 and Response #3)
p Command 190 3 (Then wait for Response 190 4)
P Command 190 4 (Optional)

The invention claimed is:

1. A print engine simulator for a development system including a print controller adapted to communicate with a print engine to thereby control said print engine, the simulator comprising:
    interpreter means for interpreting a communication from the print controller into hierarchical communication elements;
    a state machine representation of the print engine, said state machine being responsive to the communication from the print controller; and
    display means adapted to display at least one of the communication from the print controller, the hierarchical communication elements, and a communication from the state machine in response to the communication from the print controller.

2. A print engine simulator according to claim 1, wherein:
    the communication from the print controller comprises a sequence of data link layer packets; and
    the hierarchical communication elements comprise at least one of:
    (i) said link layer packets;
    (ii) a header associated with the link layer packets;
    (iii) a checksum associated with the link layer packets;
    (iv) an application layer packet formed from said link layer packets;
    (v) a print engine command associated with the application layer packet;
    and
    (vi) arguments associated with the print engine command.

3. A print engine simulator according to claim 1, wherein the state machine representation comprises:
    a first plurality of print engine states each being able to assume one or more state values; and
    a second plurality of state transitions and associated time delays, wherein the communication from the state machine being in response to the communication from the print controller is dependent upon at least one of:
    values of the first plurality of print engine states prior to the print engine simulator receiving the communication from the print controller;
    said communication from the print controller; and
    expiry of a time period.

4. A print engine simulator according to claim 2, wherein the display means is adapted to display at least one of the hierarchical communication elements.

5. A print engine simulator according to claim 4, wherein the display means comprises:
    a non-scrolling display area for displaying statistical information relating to said at least one of the hierarchical communication elements; and
    a scrolling display area for dynamically displaying the communication from the print controller.

6. A print engine simulator according to claim 2, further comprising:
   error detection means for detecting an illegal condition in at least one of said hierarchical communication elements;
   error display means for presenting the detected illegal condition on said display means; and
   reset means for resetting said state machine representation of the print engine.

7. A print engine simulator for a development system including a print controller adapted to communicate with a print engine to thereby control said print engine, the simulator comprising:
   a memory for storing a program; and
   a processor for executing the program, said program comprising:
   code for providing a state machine representation of the print engine, said state machine being responsive to a communication from the print controller;
   code for interpreting said communication from the print controller into hierarchical communication elements; and
   code for displaying at least one of the communication from the print controller, the hierarchical communication elements, and a communication from the state machine in response to communication from the print controller.

8. A development system including a print engine simulator, and a print controller adapted to communicate with a print engine to thereby control said print engine, wherein the simulator comprises:
   interpreter means for interpreting a communication from the print controller into hierarchical communication elements;
   a state machine representation of the print engine, said state machine being responsive to the communication from the print controller; and
   display means adapted to display at least one of the communication from the print controller, the hierarchical communication elements, and a communication from the state machine in response to the communication from the print controller.

9. A method of simulating a print engine for a development system including a print controller adapted to communicate with said print engine to thereby control said print engine, the method comprising steps of:
   providing a state machine representation of the print engine, said state machine being responsive to a communication from the print controller;
   interpreting said communication from the print controller into hierarchical communication elements; and
   displaying at least one of the communication from the print controller, the hierarchical communication elements, and a communication from the state machine in response to the communication from the print controller.

10. A computer-readable medium storing a computer-executable program which directs a processor to execute a method for simulating a print engine for a development system including a print controller adapted to communicate with said print engine to thereby control said print engine, said program comprising:
   code for providing a state machine representation of the print engine, said state machine being responsive to a communication from the print controller;
   code for interpreting said communication from the print controller into hierarchical communication elements; and
   code for displaying at least one of the communication from the print controller, the hierarchical communication elements, and a communication from the state machine in response to the communication from the print controller.

11. A computer-readable medium according to claim 10, wherein:
   the communication from the print controller comprises a sequence of data link layer packets, and the code for interpreting said communication from the print controller into hierarchical communication elements comprises:
   (i) code for interpreting said link layer packets;
   (ii) code for interpreting a header associated with the link layer packets;
   (iii) code for interpreting a checksum associated with the link layer packets;
   (iv) code for interpreting an application layer packet formed from said link layer packets;
   (v) code for interpreting a print engine command associated with the application layer packet; and
   (vi) code for interpreting arguments associated with the print engine command.

12. A computer-readable medium according to claim 10, wherein the code for providing the state machine representation comprises:
   code for a first plurality of print engine states each being able to assume one or more state values; and
   code for a second plurality of state transitions and associated time delays, wherein the communication from the state machine being in response to the communication from the print controller is dependent upon at least one of:
   values of the first plurality of print engine states prior to the print engine simulator receiving the communication from the print controller;
   said communication from the print controller; and
   expiry of a time period.

13. A computer-readable medium according to claim 11, further comprising:
   code for detecting an illegal condition in at least one of said hierarchical communication elements;
   code for presenting the detected illegal condition on said display means; and
   code for resetting said state machine representation of the print engine.

* * * * *

UNITED STATES PATENT AND TRADEMARK OFFICE
CERTIFICATE OF CORRECTION

PATENT NO. : 7,035,779 B2
APPLICATION NO. : 10/022505
DATED : April 25, 2006
INVENTOR(S) : Coenraad J. Jacobsz It is certified that error appears in the above-identified patent and that said Letters Patent is hereby corrected as shown below:

COLUMN 1:
Line 44, "pent" should read -- print --.

COLUMN 10:
Line 44, "it gets" should read -- they get --.

COLUMN 12:
Lines 40, 41, 42 and 44, "190" should read -- # --.

COLUMN 13:
Line 10, "packet" should read -- packets --;
Line 18, "of" should read -- to --;
Line 55, "e.g" should read -- e.g. --; and
Line 62, "3 Bitmap" should read -- 3 Bitmap done --.

COLUMN 14:
Line 2, "he" should read -- the --;
Lines 6, 7 and 9, "190" (both occurrences) should read -- # --; and
Line 10, "190" should read -- # --.

Signed and Sealed this

Twenty-sixth Day of December, 2006

JON W. DUDAS
*Director of the United States Patent and Trademark Office*